(12) United States Patent
Abbasi Gavarti et al.

(10) Patent No.: US 10,910,500 B2
(45) Date of Patent: Feb. 2, 2021

(54) LOAD SENSING DEVICES, PACKAGES, AND SYSTEMS

(71) Applicant: STMicroelectronics S.r.l., Agrate Brianza (IT)

(72) Inventors: Mohammad Abbasi Gavarti, Milan (IT); Daniele Caltabiano, Agrate Brianza (IT); Marco Omar Ghidoni, Melzo (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 75 days.

(21) Appl. No.: 15/895,513

(22) Filed: Feb. 13, 2018

(65) Prior Publication Data

US 2019/0252556 A1  Aug. 15, 2019

(51) Int. Cl.
*H01L 29/84* (2006.01)
*H01L 23/00* (2006.01)
(Continued)

(52) U.S. Cl.
CPC ............ *H01L 29/84* (2013.01); *G01L 1/18* (2013.01); *H01L 23/047* (2013.01); *H01L 23/06* (2013.01); *H01L 23/10* (2013.01); *H01L 24/05* (2013.01); *H01L 24/32* (2013.01); *H01L 24/48* (2013.01); *H01L 24/73* (2013.01); *H01L 29/0657* (2013.01); *H01L 29/16* (2013.01); *H01L 24/33* (2013.01); *H01L 2224/04042* (2013.01); *H01L 2224/29111* (2013.01); *H01L 2224/29117* (2013.01); *H01L 2224/29139* (2013.01); *H01L 2224/29144* (2013.01); *H01L 2224/32245* (2013.01); *H01L 2224/33181* (2013.01);
(Continued)

(58) Field of Classification Search
None
See application file for complete search history.

(56) References Cited

U.S. PATENT DOCUMENTS

| 5,448,444 A | 9/1995 | Provenzano et al. |
| 2008/0208425 A1 | 8/2008 | Riccoti et al. |

(Continued)

FOREIGN PATENT DOCUMENTS

| CN | 101046368 A | 10/2007 |
| CN | 101268350 A | 9/2008 |

(Continued)

OTHER PUBLICATIONS

Zwijze, Robert et al., "Low-cost piezoresistive silicon load cell independent of force distribution," Journal of Micromechanics and Microengineering, Jan. 1, 2000, 5 pages.

(Continued)

*Primary Examiner* — Nilufa Rahim
(74) *Attorney, Agent, or Firm* — Slater Matsil, LLP

(57) ABSTRACT

In an embodiment of the present invention, a load sensor package includes a housing having a cap, a column, a peripheral structure, and a base. The base includes a major surface configured to mount a stress sensor, while the cap includes a cap major surface configured to receive a load to be measured. The column is configured to transfer a predetermined fraction of the load to be measured to the base through the stress sensor. The peripheral structure is configured to transfer the remaining fraction of the load to be measured to the base.

32 Claims, 15 Drawing Sheets

(51) Int. Cl.
*H01L 23/06* (2006.01)
*H01L 29/16* (2006.01)
*H01L 23/10* (2006.01)
*H01L 29/06* (2006.01)
*G01L 1/18* (2006.01)
*H01L 23/047* (2006.01)

(52) U.S. Cl.
CPC ........... *H01L 2224/48105* (2013.01); *H01L 2224/48155* (2013.01); *H01L 2224/73215* (2013.01); *H01L 2224/73265* (2013.01); *H01L 2924/01032* (2013.01)

(56) References Cited

U.S. PATENT DOCUMENTS

| | | | |
|---|---|---|---|
| 2012/0104521 A1* | 5/2012 | Higashi | G01L 9/0042 257/419 |
| 2013/0118268 A1 | 5/2013 | Shimazu et al. | |
| 2014/0007705 A1* | 1/2014 | Campbell | G01L 1/148 73/862.628 |
| 2017/0307405 A1* | 10/2017 | Allen | G01D 3/08 |
| 2017/0343430 A1* | 11/2017 | Caltabiano | G01L 1/18 |
| 2018/0306656 A1 | 10/2018 | Guidetti et al. | |
| 2019/0252556 A1 | 8/2019 | Abbasi Gavarti et al. | |

FOREIGN PATENT DOCUMENTS

| | | |
|---|---|---|
| CN | 209979104 U | 1/2020 |
| EP | 0742893 A1 | 11/1996 |

OTHER PUBLICATIONS

Zwijze, Robert, "Micro-machined high capacity silicon load cells," Jan. 1, 2000, 211 pages.

Kanda, Yozo, "A Graphical Representation of the Piezoresistance Coefficients in Silicon," IEEE Transactions on Electron Devices, vol. ED-29, No. 1, Jan. 1982, 64 pages.

Buttay, Cyril, et al., "Die Attach of Power Devices Using Silver Sintering—Bonding Process Optimization and Characterization," IMAPS, High Temperature Electronics Network (HiTEN), Jul. 2011, Oxford, United Kingdom, 2011, 8 pages.

Weigerink, Remco, et al., "Quasi Monolithic Silicon Load Cell for Loads up to 1000 kg with Insensitivity to Non-homogeneous Load Distributions," MEM* 99, Orlando, Florida, Jan. 17-21, 1999, 6 pages.

Zwijze, Robert et al., "Micro-Machined High Capacity Silicon Load Cells," Journal of Micromechanics and Microengineering, Feb. 11, 2000, 8 pages.

* cited by examiner

LOAD SENSING DEVICES, PACKAGES, AND SYSTEMS

TECHNICAL FIELD

The present disclosure relates to sensing devices, and in particular embodiments, to load sensing devices, packages, and systems.

BACKGROUND

Traditional load sensors utilize strain gauges with metallic resistors, such as conductive foil, that changes in resistance as a result of an applied load. Alternative thin metal films have also been used as sensing elements. Conventional commercial silicon strain and stress sensors exploit planar piezoresistive effects of p-type and n-type silicon and also require complex design on the level of sensor or packaging to transduce an applied load to plane strain or stress.

Furthermore, in such conventional designs, high load applications require a bigger load sensor, which increases manufacturing costs rendering the produce too expensive for many applications.

A second disadvantage of conventional load sensors arises due to variations in sensitivity due to environmental effects. For example, conventional load sensors can introduce errors in sensing due to variation of mechanical properties of the interposers in direct contact, variation of boundary conditions, and the stress caused by a mismatch between the thermal expansion coefficient of the sensing element, package and die attach materials. In addition, lower cost sensors use non-linear materials such as rubbers and gels that change non-linearly with external environment introducing significant errors.

SUMMARY

In accordance with an embodiment of the present invention, a load sensor package includes a housing having a cap, a column, a peripheral structure, and a base. The base includes a major surface configured to mount a stress sensor, while the cap includes a cap major surface configured to receive a load to be measured. The column is configured to transfer a predetermined fraction of the load to be measured to the base through the stress sensor. The peripheral structure is configured to transfer the remaining fraction of the load to be measured to the base.

In accordance with another embodiment of the present invention, a sensor system includes a semiconductor substrate, a first bridge circuit, and a second bridge circuit. The first bridge circuit includes a first semiconductor stress sensor disposed in the semiconductor substrate. The first semiconductor stress sensor is in a plane stress state. The second bridge circuit includes a second semiconductor stress sensor disposed in the semiconductor substrate. The second semiconductor stress sensor is responsive to changes of in-plane and out-of-plane stresses.

In accordance with another embodiment of the present invention, a load sensor includes a first semiconductor layer that includes a first major surface configured to receive a load to be measured. A second semiconductor layer is disposed under the first semiconductor layer. The second semiconductor layer includes a first resistor and a second resistor. The first resistor is oriented in a first direction and includes a first type of doping. The second resistor is oriented in the first direction comprising the first type of doping, where the first semiconductor layer includes a second major surface configured to be attached to the second semiconductor layer. A die bonding layer is disposed between the first semiconductor layer and the second semiconductor layer. The die bonding layer includes a first opening, where the first opening is disposed directly over the first resistor and overlaps the first resistor, and the second resistor contacts the die bonding layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art.

Embodiments of the present invention exploit vertical and planar piezoresisitivity effect to accurately measure a load applied to the sensor. The load cell described in various embodiments below is designed to be used over a wide range of loading conditions by using a package design that transmits a pre-determined fraction of the applied load thereby allowing a smaller sensor to measure a much larger load than possible with conventional sensors.

In accordance with embodiments of the present disclosure, a sensing device including a load sensor and a load sensor package is described. The load sensor is enclosed in a load sensor package which is configured to improve stress measurement accuracy with high sensitivity and accommodate a wide range of loads. The load sensor is configured to measure stress by observing the piezoresistive effects of a semiconductor material. The piezoresistive effect of a semiconductor material is a fractional change in resistivity caused by an applied stress, such as due to force or pressure.

A schematic of a load sensor circuit in accordance with various embodiments of the present invention will be described using FIG. 1. Various embodiments of the load sensor will be described using FIG. 2. Various embodiments of the load sensor package will be described using FIGS. 3-6. The design, fabrication, assembly, calibration and testing of the load sensor and load sensor package will be described using the flow chart of FIG. 7.

Figure 1A:
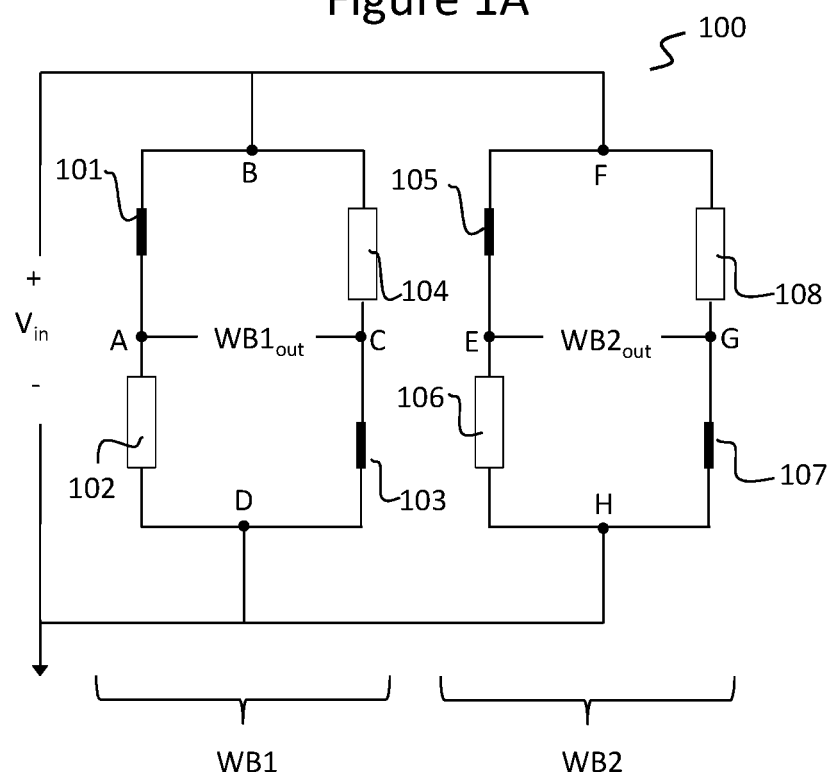
FIG. 1A illustrates an example schematic representation of an interconnection of a load sensor.

FIG. 1A illustrates a schematic representation of a load sensor circuit 100. The load sensor circuit 100 comprises a plurality of resistors that includes a first resistor 101, a second resistor 102, a third resistor 103, a fourth resistor 104, a fifth resistor 105, a sixth resistor 106, a seventh resistor 107, and an eighth resistor 108. In the illustrated embodiment, the first resistor 101, the third resistor 103, the fifth resistor 105, and the seventh resistor 107 are p-type piezoresistors, collectively referred to as the p-type piezoresistors, and the second resistor 102, fourth resistor 104, sixth resistor 106, and eighth resistor 108 are n-type piezoresistors, collectively referred to as the n-type piezoresistors.

With an applied mechanical strain, each of the first to eighth resistors 101-108 experiences a change in resistivity due to the piezoresistive effect. This change in resistivity depends on the piezoresistive coefficients for a given doping level in a particular crystal direction through which each piezo-resistor is implemented. For each of the first to eighth resistors 101-108, the resistance of the corresponding resistor is a function of the longitudinal, transversal, and vertical stresses. In reaction to stress, a representative change in resistivity along the same direction of applied field (E), for example $$\left(\frac{\Delta \rho_{xx}}{\rho}\right)$$

can be measured using known piezoresistive coefficients ($\pi_l$, $\pi_t$, and $\pi_v$) in the longitudinal, transversal, and vertical directions, where the stress ($\sigma_l$, $\sigma_t$, and $\sigma_v$) correspond to the associated value of stress in the longitudinal, transversal, and vertical directions. In this context, longitudinal and transversal directions are in the (001) crystal plane of silicon, consequently in parallel and in transvers to each resistor, while the vertical direction is perpendicular to the (001) crystal plane of silicon.

$$\frac{\Delta \rho_{xx}}{\rho} = \pi_l \sigma_l + \pi_t \sigma_t + \pi_v \sigma_v$$

Although Wheatstone bridges are used in the above circuit, embodiments of the present invention may be applied using other types of resistive bridge circuits including current mode bridge circuits and active bridge circuits.

Figure 1B:
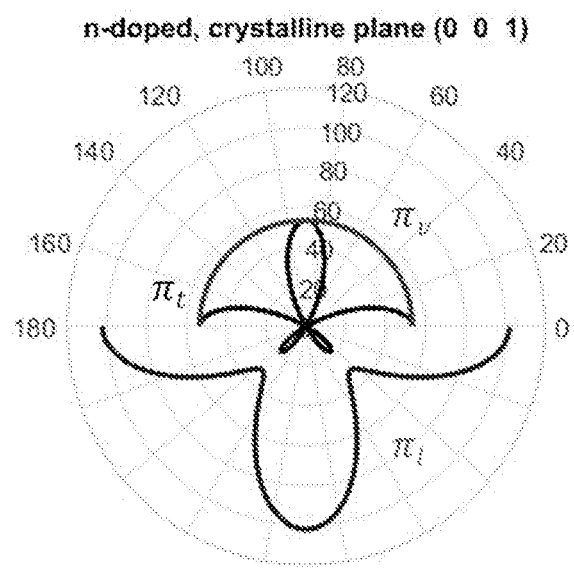
FIG. 1B illustrates a graphical representation of n-doped piezoresistive coefficients in the (001) crystal plane silicon.

FIG. 1B illustrates the n-type piezoresistive coefficients of silicon. As stress increases, piezoresistive coefficients with positive values represent an increase in resistivity and piezoresistive coefficients with negative values represent a decrease in resistivity. As shown in the figure, n-type silicon resistors are most sensitive to longitudinal and transverse stresses in crystal direction <100> of the crystal plane (001), whereas, the n-type vertical piezoresistivity coefficient is not sensitive to the plane direction of resistor and has a constant sensitivity to vertical stress in all plane directions. In n-type silicon resistors, at room temperature, the transversal and vertical piezoresistive coefficients are positive values and the longitudinal piezoresistive coefficient is a negative value.

In contrast, p-type silicon resistors are most sensitive to longitudinal and transverse stress at 45° (crystal direction <110>) in the crystal plane (001) of silicon. In p-type silicon resistors, at room temperature, the longitudinal piezoresistive coefficient is a positive value and the transversal piezoresistive coefficient is a negative value. The vertical piezoresistive coefficient in a p-type piezoresistor is smaller relative to the longitudinal and transverse coefficients.

As a result, the change in resistivity of each of the first to eighth resistors 101-108 can be observed due to the relationship described above $$\left(\frac{\Delta \rho_{xx}}{\rho} = \pi_l \sigma_l + \pi_t \sigma_t + \pi_v \sigma_v\right).$$

In the illustrated embodiment, the first resistor 101, second resistor 102, third resistor 103, and fourth resistor 104 are electrically configured to form a first Wheatstone bridge WB1. The first resistor 101 and the second resistor 102 are connected in series at node A, the third resistor 103 and the fourth resistor 104 are connected in series at node C, and the first resistor 101 and the fourth resistor 104 are connected at node B and the second resistor 102 and the third resistor 103 are connected at node D. The fifth resistor 105, sixth resistor 106, seventh resistor 107 and eighth resistor 108 are electrically configured to form a second Wheatstone bridge WB2. Similar to the first Wheatstone bridge WB1, the fifth resistor 105 is connected in series with the sixth resistor 106 at node E, the seventh resistor 107 is connected in series with the eighth resistor 108 at node G, and the two series branches are connected in parallel with the fifth resistor 105 connected to the eighth resistor 108 at node F and the sixth resistor 106 connected to the seventh resistor 107 at node H.

In the illustrated embodiment, a single input voltage $V_{in}$ is applied across the first Wheatstone bridge WB1 at nodes B and D and across the second Wheatstone bridge WB2 at nodes F and H.

The first Wheatstone bridge WB1 differs from the second Wheatstone bridge WB2 because although the first resistor 101 is similar to the fifth resistor 105 and the third resistor 103 is similar to the seventh resistor 107, the second resistor 102 is different from the sixth resistor 106. Similarly, the fourth resistor 104 is different from the eighth resistor 108. In particular, the substantial difference between these resistors in the first Wheatstone bridge WB1 and the second Wheatstone bridge WB2 is the absence of vertical stress (or significantly reduced) in the second and fourth resistors 102 and 104 relative to the sixth and eight resistors 106 and 108.

Thus, the first Wheatstone bridge WB1 measures a change in resistance as a result of plane stress conditions (in the absence of vertical stress). An output voltage of the first Wheatstone bridge $WB1_{out}$ is measured between nodes A and C. The second Wheatstone bridge WB2 measures a change in resistance as a result of three-dimensional stress. An output voltage of the second Wheatstone bridge $WB2_{out}$ is measured between nodes E and G.

By observing the difference between the output of the second Wheatstone bridge $WB2_{out}$ and the output of the first Wheatstone bridge $WB1_{out}$, an applied vertical stress $\sigma_v$ may be determined.

$$\sigma_v = \frac{WB2_{out}}{S_2 V_{in}} - k\left(\frac{WB1_{out}}{S_1 V_{in}}\right)$$

A correction factor, k, has been included to compensate for any difference in in-plane components that are measured by the second resistor 102 and the fourth resistor 104 of the first Wheatstone bridge WB1 respect to the sixth resistor 106 and eighth resistor 108 of the second Wheatstone bridge WB2. $S_1$ and $S_2$ are the relative sensitivities for each bridge.

Due to a relatively lower piezoresistivity from vertical stress in p-type (100) silicon piezoresistors in the <100> or <010> directions, the first resistor 101, third resistor 103, fifth resistor 105 and seventh resistor 107 function as reference resistors for the first Wheatstone bridge WB1 and the second Wheatstone bridge WB2.

Embodiments of the invention may be applied to any semiconductor material and crystal orientation as long as resistors can be fabricated in that material whose resistance changes with vertical stress (e.g., fifth and seventh resistors 105 and 107), and another type whose resistances are independent of vertical stress (e.g., second and fourth resistors 102 and 104).

Figure 1C:
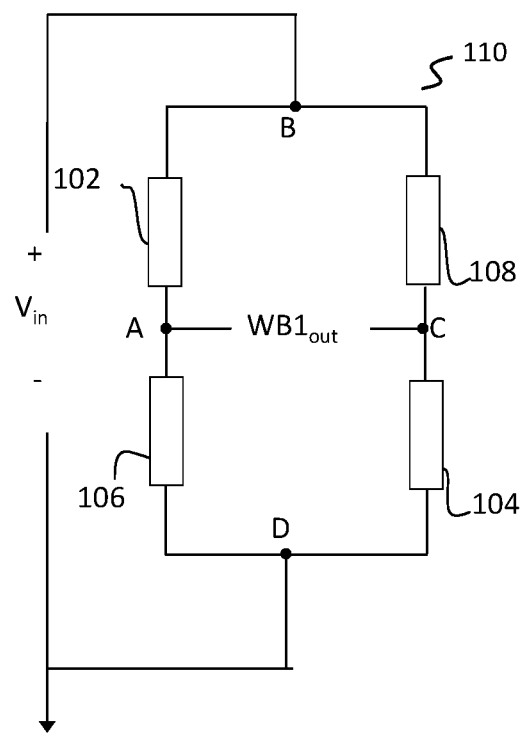
FIG. 1C illustrates an example schematic representation of an interconnection of a load sensor.

FIG. 1C illustrates an alternative schematic representation of a load sensor circuit 110. In the illustrated embodiment, a smaller subset of four resistors from the eight resistors described in embodiment of FIG. 1A is used to form a bridge circuit. In order to maintain clarity, the naming of the resistors between FIGS. 1A and 1C is maintained.

In the illustrated circuit of FIG. 1C, the load sensor circuit includes the second resistor 102, the fourth resistor 104, the sixth resistor 106, and the eighth resistor 108, which are all n-type piezoresistors as described previously. The output of the load sensor circuit of this embodiment may be tuned to correlate directly with the out-of-plane component of stress from an applied load. Accordingly, this embodiment may be more easily implemented as a single package.

Figure 2A:
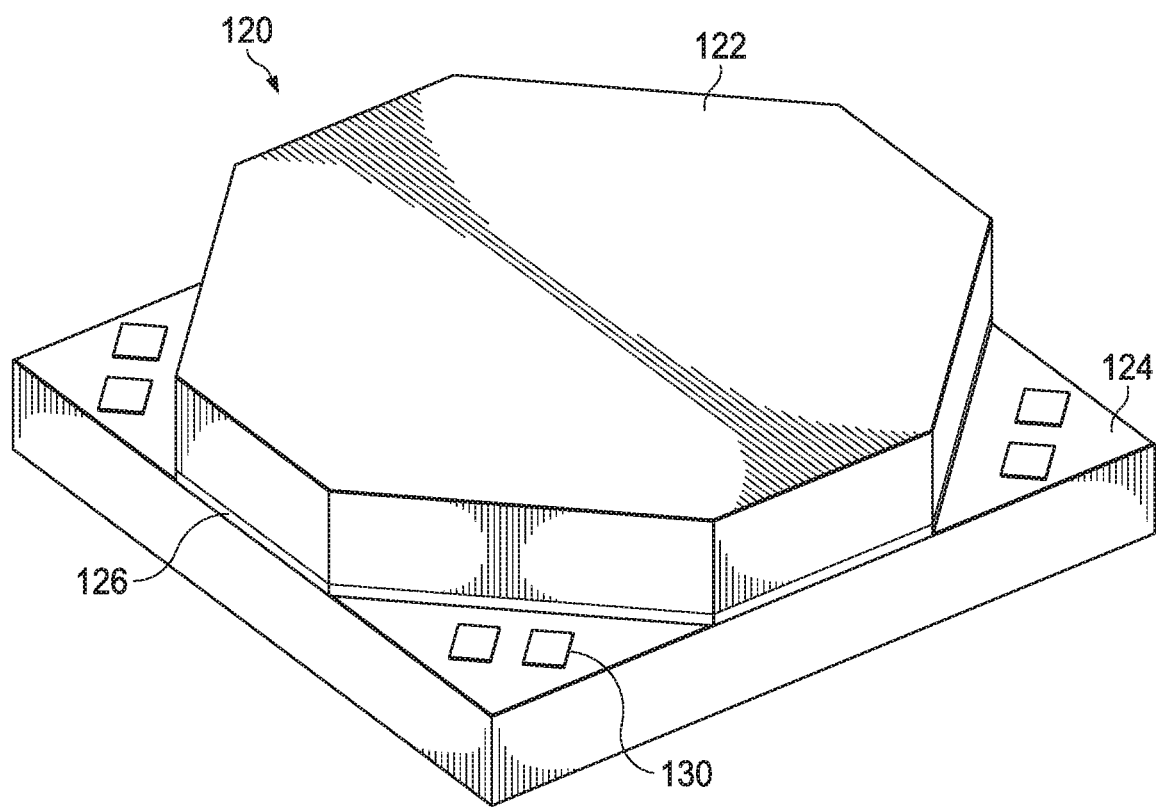
FIG. 2A illustrates an isometric view of an example embodiment of a load sensor.

FIG. 2A illustrates an isometric view of an example of a load sensor 120 used in various embodiments of the present invention. The load sensor 120 may include one or both the Wheatstone bridges described above with respect to FIG. 1A.

The load sensor 120 comprises a first semiconductor layer 122, a second semiconductor layer 124, and an adhesive bonding layer 126. In one or more embodiments, the first semiconductor layer 122 and the second semiconductor layer 124 comprise mono-crystal silicon such as (001) silicon. The first semiconductor layer 122 is connected to the second semiconductor layer 124 with an adhesive bonding layer 126 which may be a solder material, such as glass frit.

In one embodiment, the first semiconductor layer 122 and the second semiconductor layer 124 may be elastic solid bodies configured to detect in-plane and out-of-plane strains or stresses. The elastic properties of a material are represented by ultimate tensile strength (UTS) and Young's modulus (E), respectively. A material of the first semiconductor layer 122 and second semiconductor layer 124 may have, for example, a UTS of 1000 MPa and a Young's Modulus of 130-190 GPa.

The dimensions of the load sensor 120 as well as the package 140 are relative to the intended application. For example, in an application for measuring stress in the range of 1 to 500 MPa of applied load, the package may be designed to transfer a predetermined fraction of the applied load to the load sensor 120, where the predetermined fraction may be 0.1 to 0.9, the surface of a load sensor 120 may have an area of about 0.25 mm$^2$ to 100 mm$^2$ with an overall thickness between 0.2 mm to 1.5 mm.

In various embodiments, the first semiconductor layer 122 is configured to transfer the applied stresses uniformly to the underlying second semiconductor layer 124, e.g. to make a desired in-plane or/and out-of-plane stress distributions on the second semiconductor layer 124.

In the illustrated embodiment of FIG. 2A, the first semiconductor layer 122 has octagonal shape which exposes the top four corners of the second semiconductor layer 124. The exposed corners of the second semiconductor layer 124 may include load sensor pads 130 of the load sensor 120. Embodiments of the invention enable making a symmetric structure by spreading the connection pads in all four corners. Advantageously, the position of the load sensor pads 130 provides flexibility for machine wire bonding. Furthermore, an octagonal first semiconductor layer 122 exerts less stress concentration on the edges of the second semiconductor layer 124 while maintaining robustness of the first semiconductor layer 122 for bonding and dicing. In other embodiments, the first semiconductor layer 122 may be shaped differently. In an alternative embodiment, the load sensor may incorporate a quadrangle first semiconductor layer 122 with load sensor pads 130 positioned on a single side of the second semiconductor layer 124.

Figure 2B:
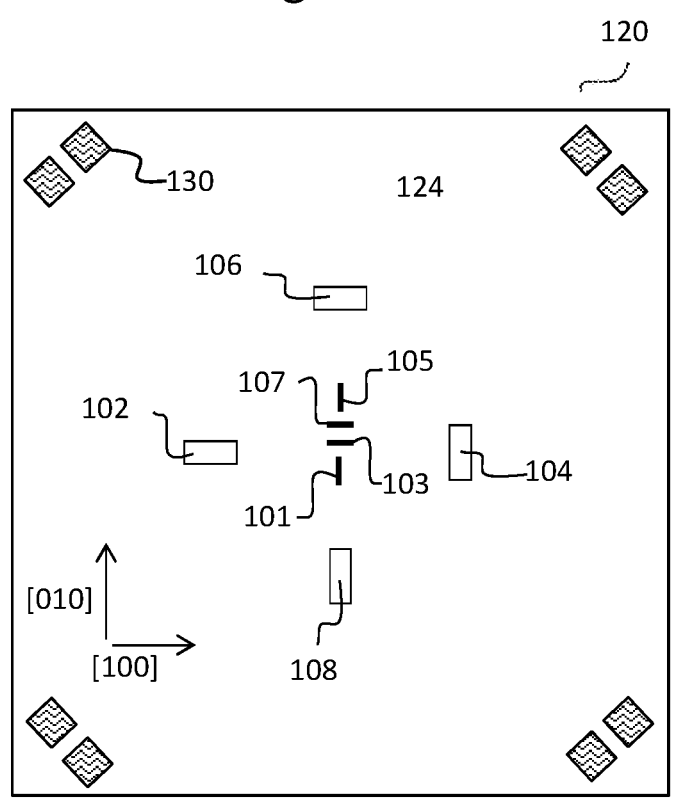
FIG. 2B illustrates a plan view of the bottom layer of a load sensor.

FIG. 2B illustrates a schematic layout of the second semiconductor layer 124 of a load sensor 120 illustrated in FIG. 2A.

The second semiconductor layer 124 comprises a plurality of resistors connected to form a first Wheatstone bridge WB1 and a second Wheatstone bridge WB2. The first resistor 101, second resistor 102, third resistor 103, fourth resistor 104, fifth resistor 105, sixth resistor 106, seventh resistor 107, and eighth resistor 108 in the illustrated embodiment correspond to the first to eighth resistors 101-108 of FIG. 1.

The second semiconductor layer 124 may comprise a single crystal substrate, such as, monocrystalline silicon or germanium. In the illustrated embodiment, the second semiconductor layer 124 is a silicon substrate with an exposed surface being the (100) crystal plane where the x-axis is oriented along the <100> crystal direction. The y-axis is perpendicular to the x-axis which represents the <010> crystal direction, and the z-axis is orthogonal to the x-axis and y-axis which represents the <001> crystal direction. Depending on the type of silicon substrate (p or n), the crystal direction of the silicon substrate may be differently chosen, e.g. in case of p-type silicon substrate, the main crystal directions are <110> and <110>.

The second semiconductor layer 124 is doped to form p-type piezoresistors, i.e., the first resistor 101, the third resistor 103, the fifth resistor 105, and the seventh resistor 107, and n-type piezoresistors, i.e., the second resistor 102, the fourth resistor 104, the sixth resistor 106 and the eighth resistor 108. For example, the silicon substrate may be doped with boron to form p-type piezoresistors and phosphorus or arsenic to form n-type piezoresistors. The piezoresistive coefficients of each of the first to eighth resistors 101-108 depend on its dopant type, dopant level, crystal orientation, and temperature.

In the illustrated embodiment, the first to eighth resistors 101-108 are formed in the second semiconductor layer 124, for example, by ion implantation followed by annealing. Each of the first to eighth resistors 101-108 may belong to a pair of resistors oriented orthogonally to the other. For example, in this embodiment, the first resistor 101 is orthogonal to the third resistor 103, the second resistor 102 is orthogonal to the fourth resistor 104, the fifth resistor 105 is orthogonal to the seventh resistor 107 and the sixth resistor 106 is orthogonal to the eighth resistor 108. Using a pair of resistors perpendicular to each other enables longitudinal and transverse effects to average out.

Figure 2C:
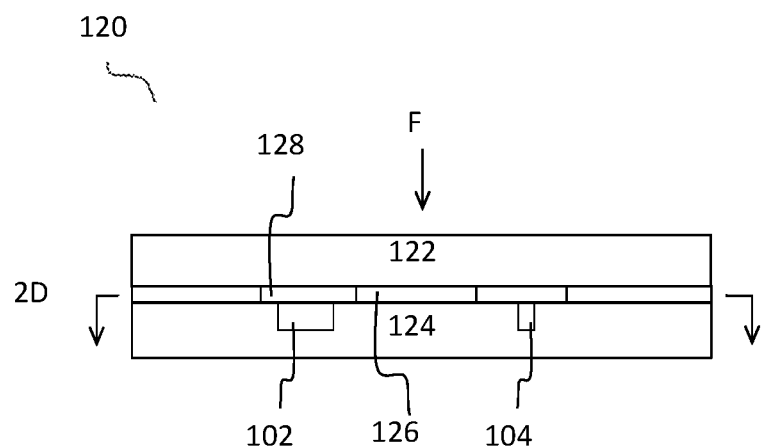
FIG. 2C illustrates a cross-sectional view of a load sensor.

FIG. 2C illustrates a cross-sectional view of a load sensor 120 illustrated in FIG. 2A. Referring to FIG. 2C, the adhesive bonding layer 126 transfers the vertical force applied on to the first semiconductor layer 122 to the second semiconductor layer 124. In the illustrated embodiment, the adhesive bonding layer 126 comprises openings 128 which exposes a portion of the second semiconductor layer 124 to the first semiconductor layer 122.

Figure 2D:
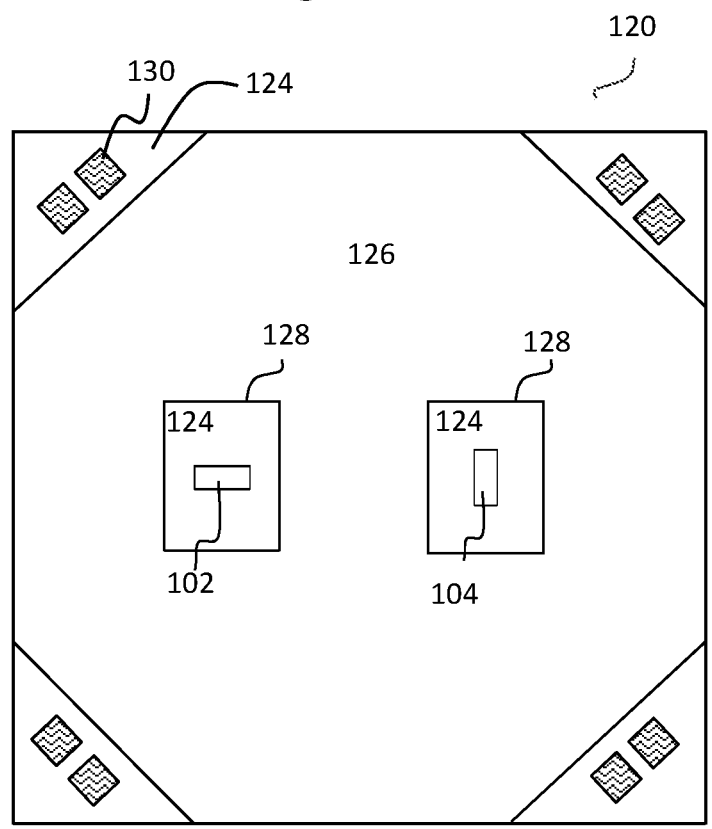
FIG. 2D illustrates a plan view of an adhesive bonding layer of a load sensor.

In this embodiment, the second resistor 102 and the fourth resistor 104 are positioned on the second semiconductor layer 124 directly beneath the openings 128 in the adhesive bonding layer 126. With the second resistor 102 and the fourth resistor 104 positioned beneath the openings 128, the second resistor 102 and fourth resistor 104 are not subjected to a vertical stress transferred from the first semiconductor layer 122. In contrast, the first resistor 101, third resistor 103, fifth resistor 105, sixth resistor 106, seventh resistor 107, and eighth resistor 108 are covered by the adhesive bonding layer 126. Therefore, they are under a compressive vertical stress transferred through the first semiconductor layer 122. A plan view of the adhesive bonding layer 126 is illustrated in FIG. 2D.

By applying vertical force "F" to a load sensor 120 of the illustrated embodiment, vertical stress from the first semiconductor layer 122 is transferred to the first resistor 101, third resistor 103, fifth resistor 105, sixth resistor 106, seventh resistor 107, and eighth resistor 108 causing longitudinal, transversal, and vertical strain. Subsequently, the longitudinal, transversal, and vertical stress. In contrast, due to the openings 128, the second resistor 102 and the fourth resistor 104 experience only a plane strain condition having essentially plane stresses.

Embodiments of the present invention further include a load sensor package 140. The load sensor package 140 ensures that the load sensor's operating window overlaps with the operating window needed for the application. For example, the load sensor package 140 may be used to measure loads that are much higher than a conventional semiconductor sensor. This is achieved in various embodiments by transmitting a predetermined fraction of the applied force to the load sensor 120. As force is applied to the load sensor package, a predetermined fraction of the applied force is transferred through the load sensor 120. The remaining applied force is supported by a peripheral structure of the load sensor package. Thus, the stress transferred through the semiconductor sensor can be within the reasonable operating window of the sensor even though a much larger force is externally applied to the package. Given a predetermined fraction of applied force can be measured by the load sensor 120, the total applied force to the package can now also be determined. Moreover, by using smaller force/stress sensor, it's possible to measure higher range of loads. Smaller sensor in semiconductor industry translates to a lower cost.

FIGS. 3A-3C, 4A-4C, 5A-5B, and 6A-6C illustrate several embodiments of a load sensor package 140. In the illustrated embodiments, the load sensor package 140 comprises a cap 142, a column 144, a peripheral structure 146, and a base 148 that together form a housing.

The cap 142 and the column 144 are formed as a single monolithic unit with the column 144 positioned in a central region of the cap 142. The peripheral structure 146 may be monolithically formed with the cap 142 (e.g., FIG. 4A and FIG. 6A) or the base 148 (e.g., FIG. 3A and FIG. 5A) in various embodiments. The cap 142 and column 144 along with the peripheral structure 146 and base 148 form a cavity 150. A load sensor 120 is housed within the cavity 150 and is protected from the outside environments by the housing of the load sensor package 140.

The top portion of the housing comprising the cap 142 and the column 144 are rigidly connected to the bottom portion of the housing comprising the peripheral structure 146 and the base 148 using a first die bonding material 151. In various embodiments, the first die bonding material 151 comprises a thickness of about 5 μm to 200 μm, for example, 50 μm in one embodiment.

The load sensor package 140 may be configured in a variety of ways to carry out the electrical signal from the load sensor 120 to the exterior of the load sensor package 140. For example, a load sensor package 140 may incorporate metallic pins for direct wire bonding or a PCB as an interconnection between the load sensor pads 130 and the metallic pins. In some embodiments, an electrical connection from the load sensor 120 to the exterior of the load sensor package 140 may be made by incorporating an integrated circuit (IC) on the base 148 and wire bonded 158 from the load sensor pads 130 of the load sensor 120 directly to the IC.

In the illustrated embodiments, a second die bonding material 152, with a thickness of approximately 5 μm to 200 μm, e.g., 50 μm in one embodiment, connects the column 144 of the load sensor 120 to the load sensor package 140. Similarly, a third die bonding material 153, with a thickness of approximately 5 μm to 200 μm, e.g., 50 μm in one embodiment, connects the load sensor 120 with the base 148 of the load sensor package 140. In various embodiments, the thickness of the first die bonding material 151, the second die bonding material 152, and the third die bonding material 153 may be designed to compensate production tolerances for both load sensor 120 and the load sensor package 140.

In some embodiments, the first die bonding material 151, the second die bonding material 152, and the third die bonding material 153 may be the same material. Having the same material may involve simultaneously sealing the load sensor package 140. Alternatively, two different materials with different processing temperatures may be used.

For example, the first die bonding material 151 and the second die bonding material 152 may comprise a same first material while the third die bonding material 153 comprises a different second material. This may allow sequentially applying these materials. For example, the third die bonding material 153 may be used to attach the load sensor 120 with the base 148 followed by attaching using the first die bonding material 151 and the second die bonding material 152. In this illustration, the third die bonding material 153 may comprise a gold-tin alloy such as $Au_{0.80}Sn_{0.20}$ that is attached first with a higher processing temperature of 320° C., while the first die bonding material 151 and the second die bonding material 152 may comprise a silver sinter that is attached later at a lower processing temperature of 240-280° C. In various embodiments, the first die bonding material 151, the second die bonding material 152 and the third die bonding material 153 may include silver sinter, gold-tin alloys such as $Au_{0.80}Sn_{0.20}$, or gold-germanide such as $Au_{0.88}Ge_{0.12}$. In alternative embodiments, the first die bonding material 151, the second die bonding material 152 and the third die bonding material 153 may be a nonmetallic material like sealing glass paste for glass, metal, and ceramic packages.

Furthermore, the load sensor package 140 may be scalable with respect to the load range required for different applications and may include a variety of materials. The materials for the different applications are chosen based on, amongst others, the coefficient of thermal expansion (CTE), Young's modulus (E), and ultimate tensile strength (UTS).

In order to produce a robust mechanical system, the coefficient of thermal expansion of the material of the load sensor package 140 may be as close as possible to the coefficient of thermal expansion of the load sensor 120. For example, the coefficient of thermal expansion of the material of the load sensor package 140 is within 10% of the coefficient of thermal expansion of the load sensor 120. The Young's modulus of the first, the second, and the third die bonding materials 151-153 should be preferably less than the semiconductor material of the load sensor to effectively transfer stress to the load sensor 120. Additionally, the material of the load sensor package 140 has to demonstrate rigidity and strength to withstand the load capacity of an application as given by Young's modulus and ultimate strength as well as being ductile to be strong enough for possible impulses and dynamic loading situations. For example, a particular application may utilize silicon (CTE=2 ppm/K, E=130-190 GPa, UTS=1000 MPa) as the material for the load sensor 120 and alloy-42 (CTE=4 ppm/K, E=145 GPa, UTS=500 MPa) as the material for the load sensor package 140.

A substantial mismatch in the coefficient of thermal expansion, equivalent mechanical stiffness of the materials of load sensor package 140 and/or misalignment during assembly may cause deviation from the designed predetermined fraction of force to be transferred to the load sensor 120 during the operation of the sensor. Consequently, such a multiaxial sensor measures the consequent induced stresses because of external variables, such as a change in temperature. As a result, significant errors can be introduced while measuring the applied force to the load sensor 120 and load sensor package 140.

Figure 3A:
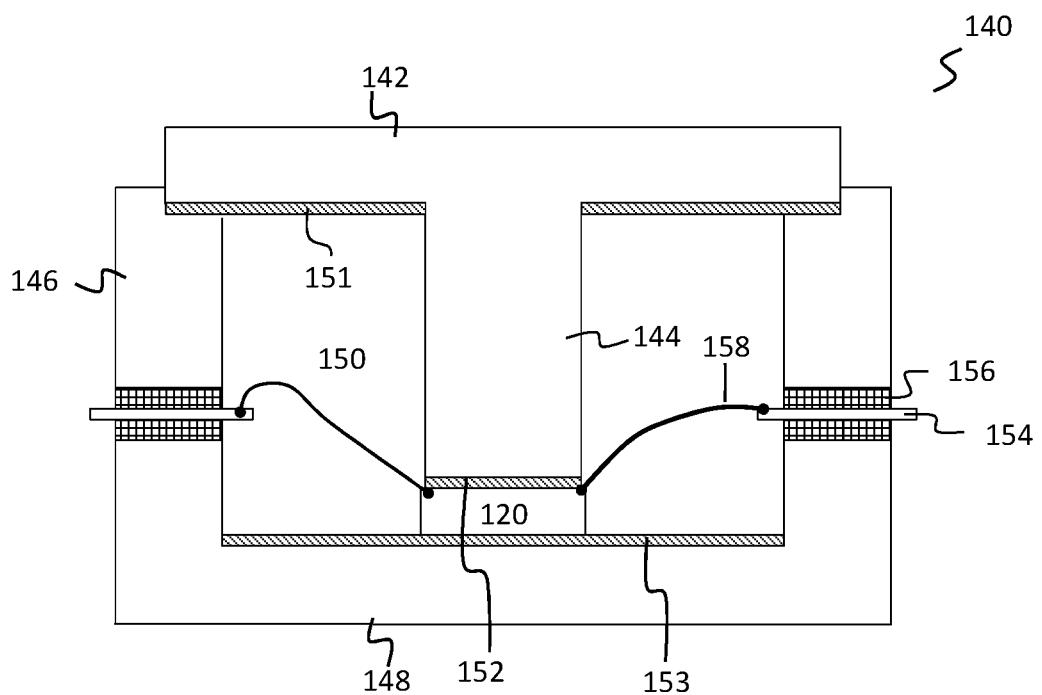
FIG. 3A illustrates a cross-sectional view of one embodiment of a load sensor package.
Figure 3B:
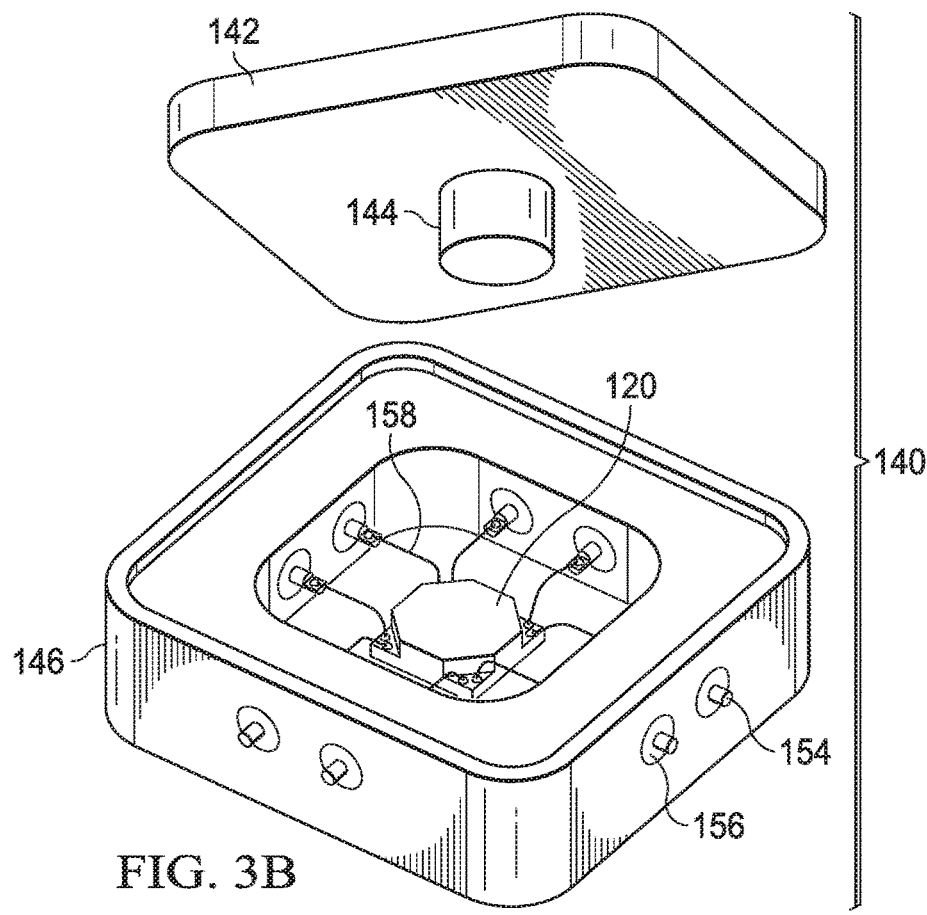
FIG. 3B illustrates a perspective view of the load sensor package of FIG. 3A.
Figure 3C:
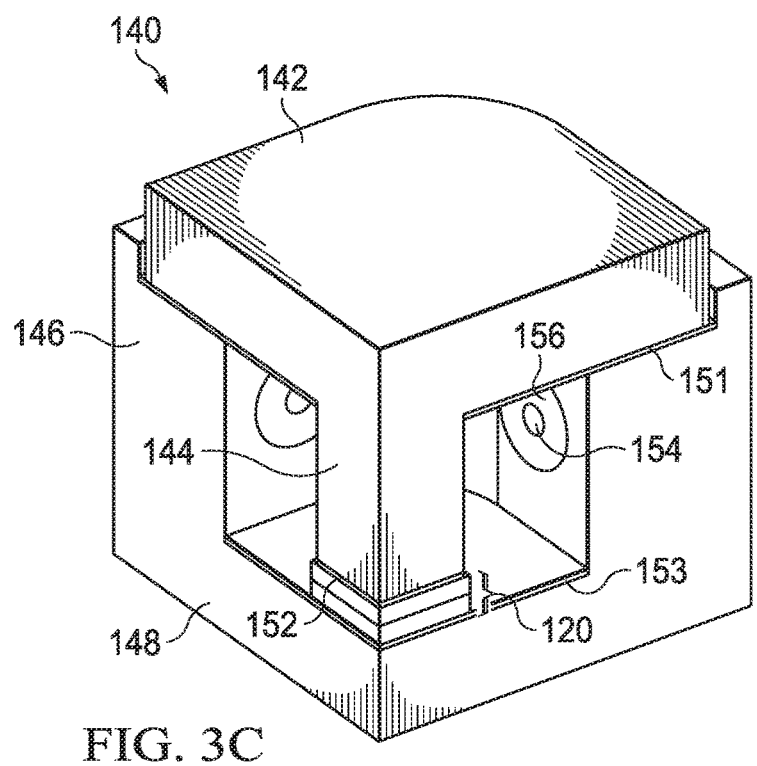
FIG. 3c illustrates a perspective view of a quarter of the load sensor package of FIG. 3B.

FIG. 3A illustrates a cross-sectional view of one embodiment of a load sensor package 140, FIG. 3B illustrates a corresponding perspective view, and FIG. 3C illustrates a perspective view of a quarter section of the load sensor package 140. In the illustrated embodiment, the cap 142 and the column 144 are monolithically formed while the peripheral structure 146 is monolithically formed with the base 148.

A plurality of metallic pins 154 extend through the peripheral structure 146. The peripheral structure 146 is hermetically sealed by a plurality of support shields 156 as illustrated in the perspective view of FIG. 3B.

In one embodiment, the plurality of metallic pins 154 comprises Kovar and the plurality of support shields 156 comprises sealing glass. The metallic pins 154 protrude into and out of the load sensor package 140 for wire bonding from the load sensor pads 130. A load sensor 120 with an octagonal shaped first semiconductor layer 122, as previously described, may have load sensor pads 130 located on the corners of the second semiconductor layer 124 which may easily be wire bonded 158 directly to the metallic pins 154.

Figure 4A:
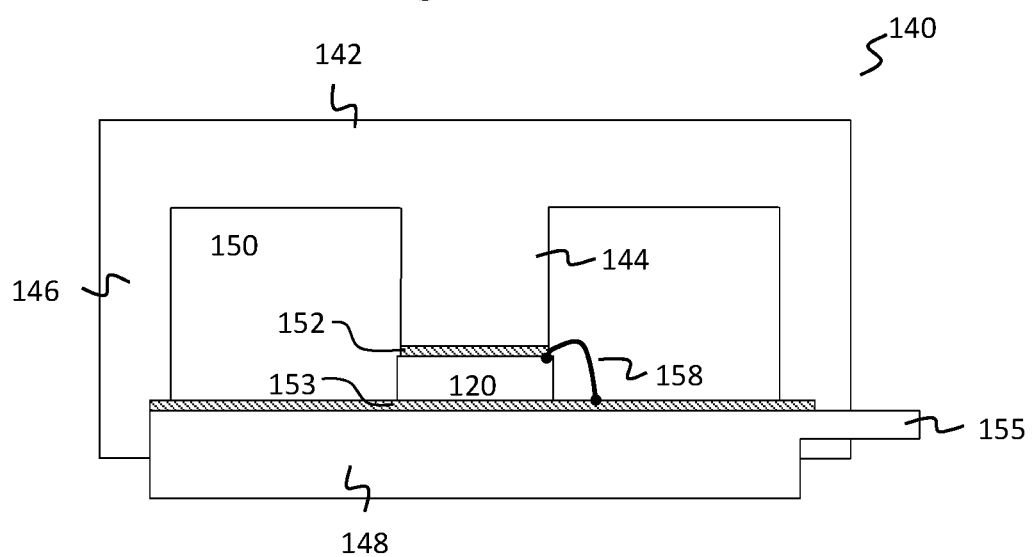
FIG. 4A illustrates a cross-sectional view of one embodiment of a load sensor package.
Figure 4B:
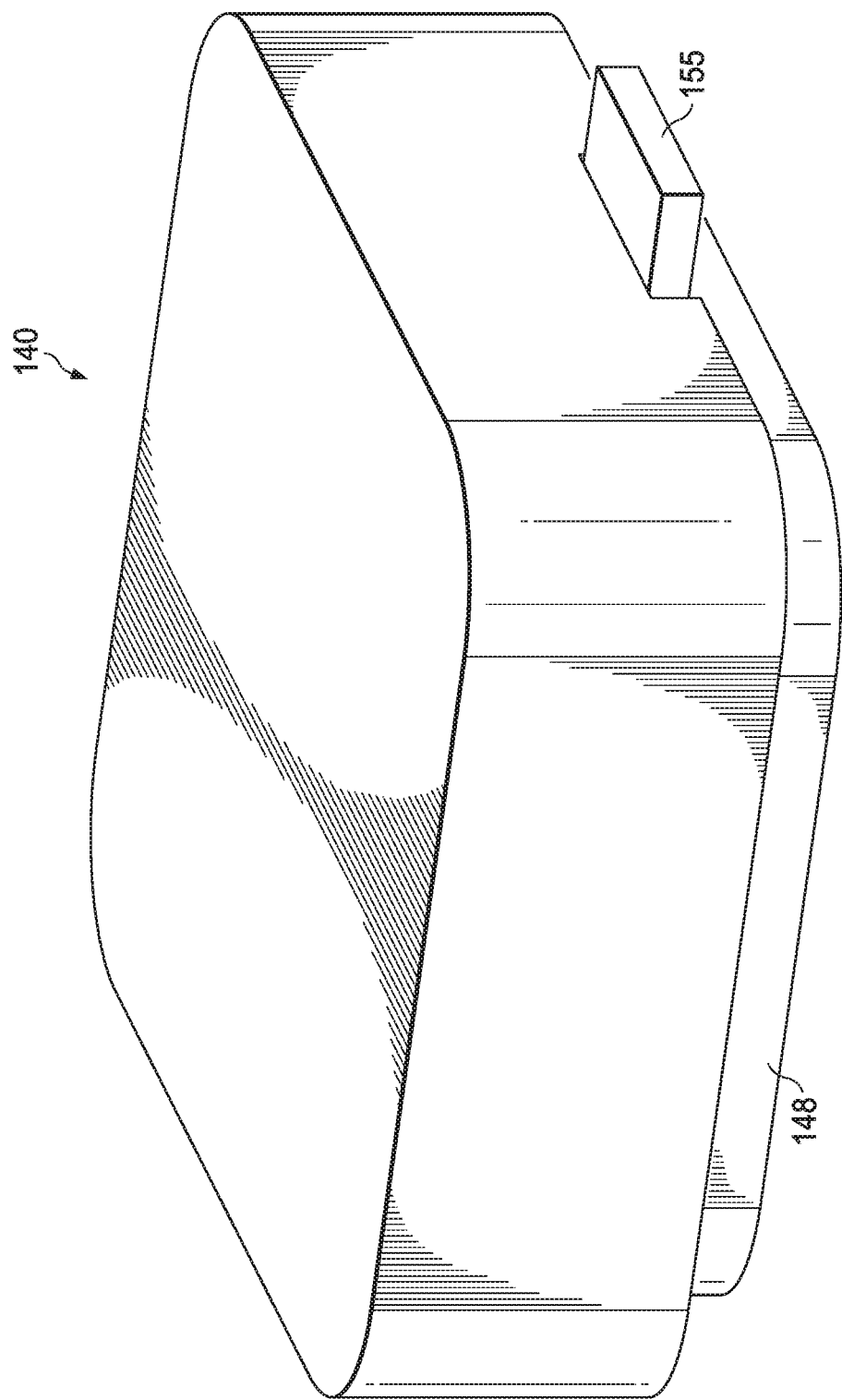
FIG. 4B illustrates a perspective view of the load sensor package of FIG. 4A.
Figure 4C:
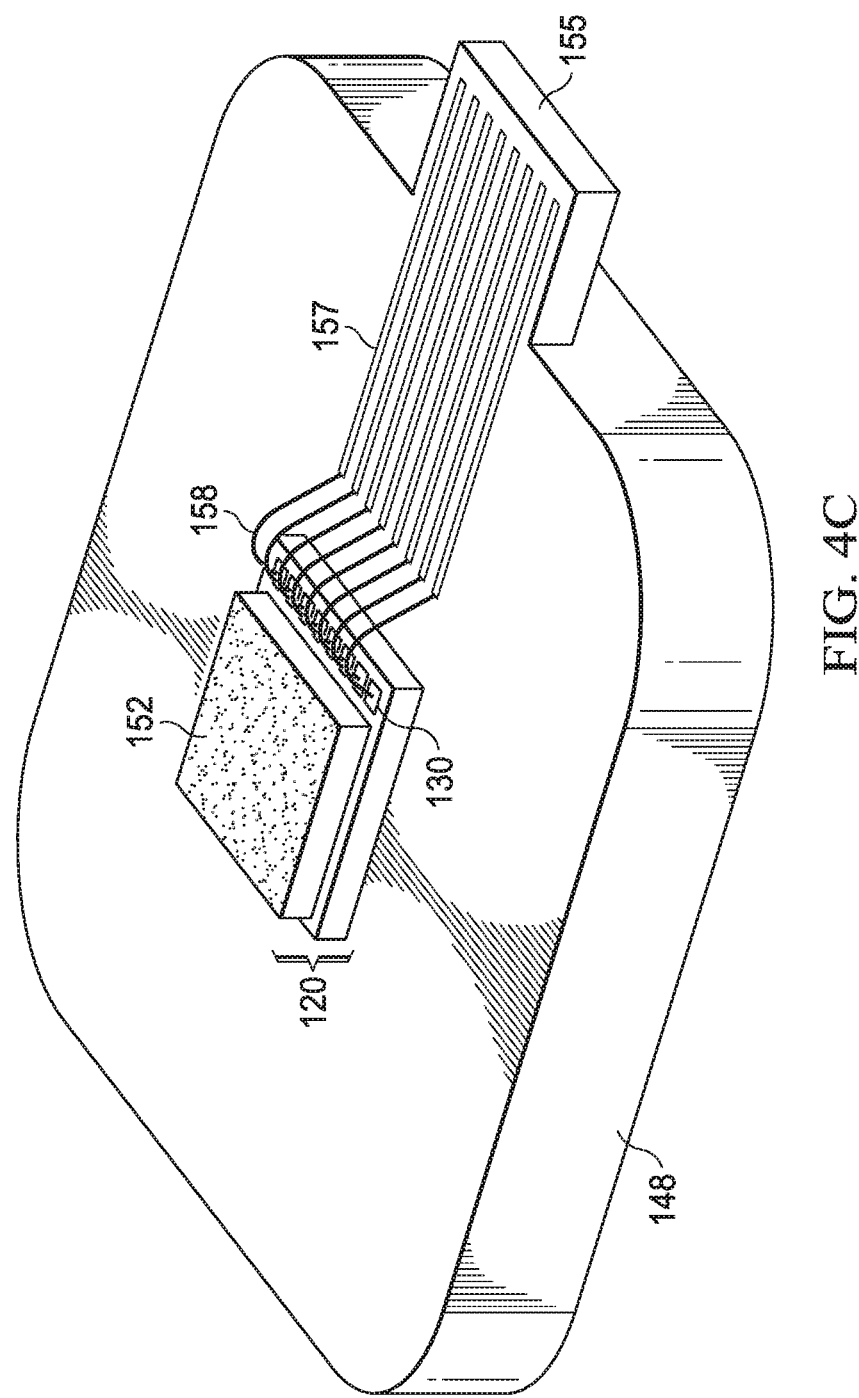
FIG. 4C illustrates a perspective view of the load sensor base of FIG. 4B.

FIG. 4A illustrates a cross-sectional view of an alternative embodiment of a load sensor package 140, FIG. 4B illustrates a perspective view, and FIG. 4C illustrates a perspective view of a base 148 of a load sensor package 140. In this embodiment, the column 144, the peripheral structure 146, and the cap 142 are formed as a single monolithic unit. The base 148 comprises a ledge 155 that is thinner than the rest of the base 148 and extends away from a side surface of the peripheral structure 146 as illustrated in FIG. 4B. As illustrated in FIG. 4C, leads may be positioned on the base from the load sensor 120 and along the ledge 155. A load sensor's pads 130 may be positioned on a single side of the load sensor 120. The load sensor pads 130 of the load sensor 120 may be aligned with the electronic routing circuit 157 of the base 148. Subsequently, the load sensor pads 130 may be machine wire bonded 158 directly to the electronic routing circuit 157 thereby providing an electrical connection to the exterior of the load sensor package 140.

Figure 5A:
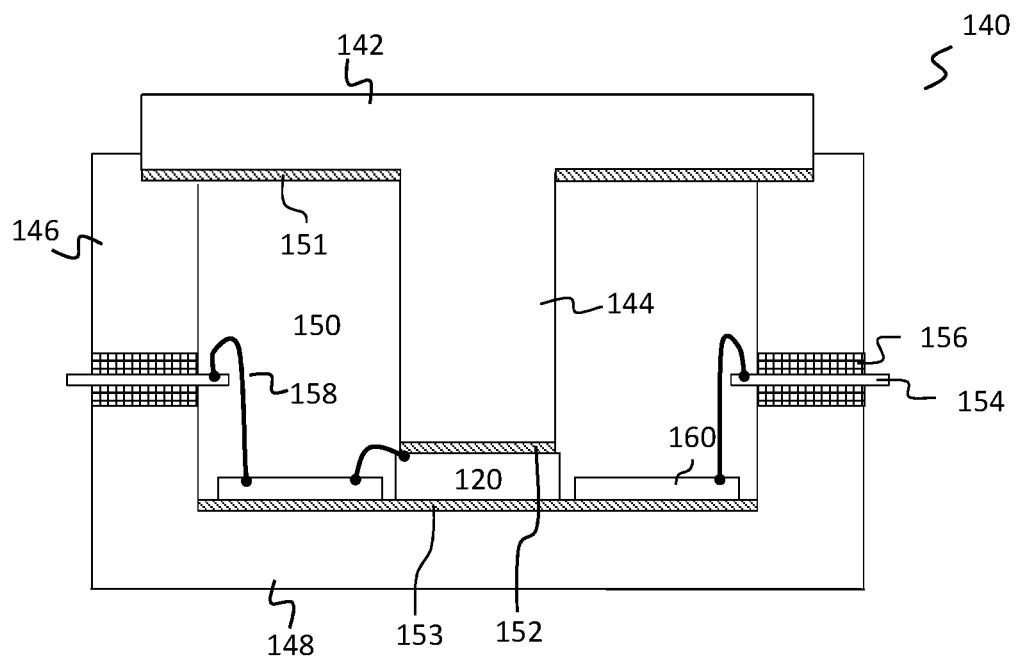
FIG. 5A illustrates a cross-sectional view of one embodiment of a load sensor package.
Figure 5B:
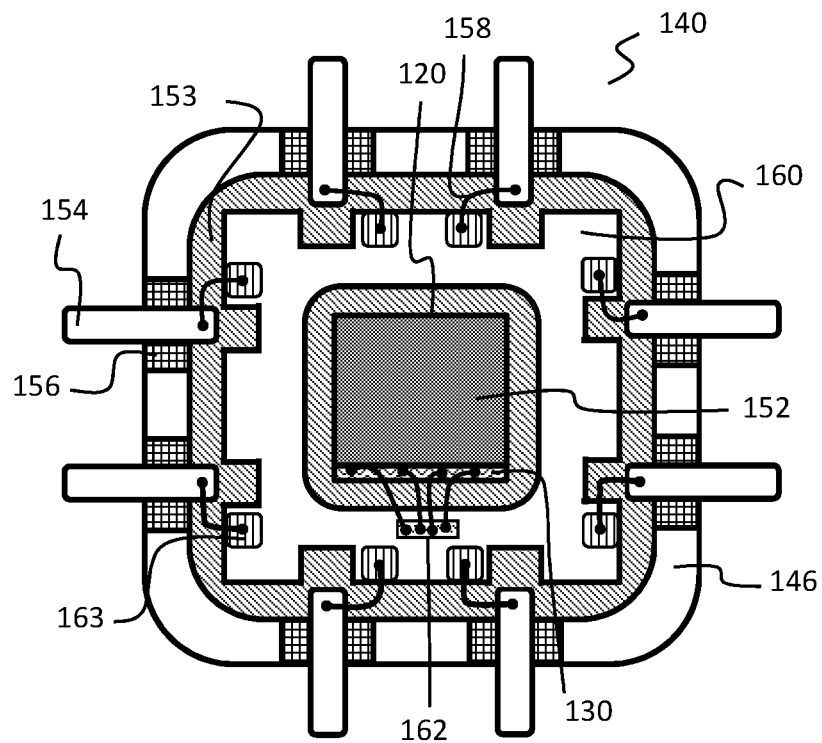
FIG. 5B illustrates a horizontal cross-sectional view of FIG. 5A.

FIG. 5A illustrates a cross-sectional view of another embodiment of a load sensor package 140 and FIG. 5B illustrates a corresponding horizontal cross-sectional view. Similar to the load sensor package 140 of FIG. 3A, the cap 142 and the column 144 are monolithically formed while the peripheral structure 146 is monolithically formed with the base 148 in the illustrated embodiment. A plurality of metallic pins 154 extend through the peripheral structure 146, and the metallic pins 154 are hermetically sealed by a plurality of support shields 156. The PCB 160 includes a central cutout region through which the load sensor 120 is attached to the base 148.

In one embodiment, load sensor pads 130 of a load sensor 120 may positioned on a single side of the sensor. A PCB 160 may be incorporated to simplify machine wire bonding and provide an electrical connection between the load sensor pads 130 and the metallic pins 154. As illustrated in FIG. 5B, the PCB 160 comprises a plurality of first bonding pads 162 and second bonding pads 163. Although not shown, the first bonding pads 162 may be electrically connected to the second bonding pads 163 with conductive tracks through the PCB 160. The load sensor pads 130 may be machine wire bonded 158 to the first bonding pads 162 and the second bonding pads 163 may be machine wire bonded 158 to the metallic pins 154.

Figure 6A:
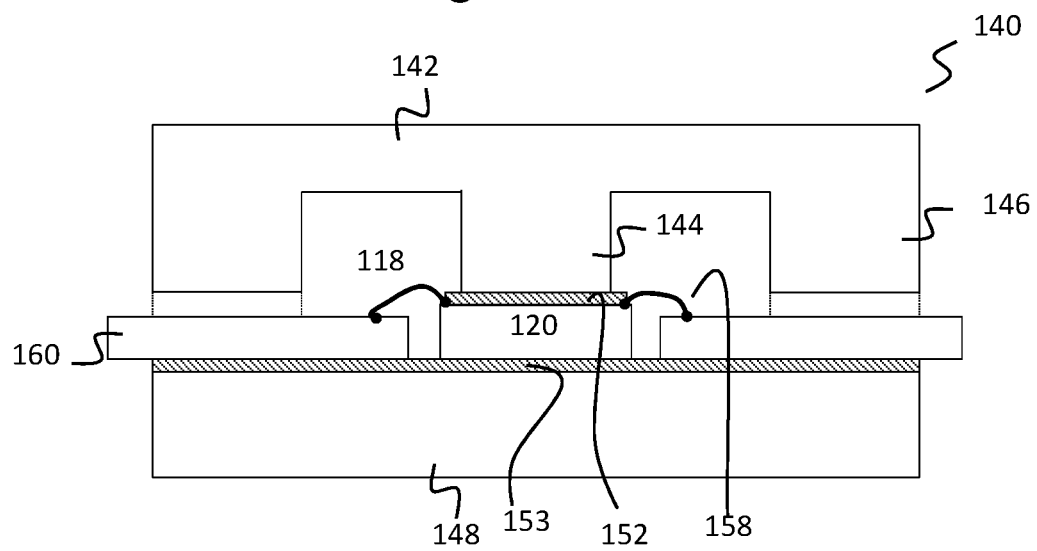
FIG. 6A illustrates a cross-sectional view of one embodiment of a load sensor package.
Figure 6B:
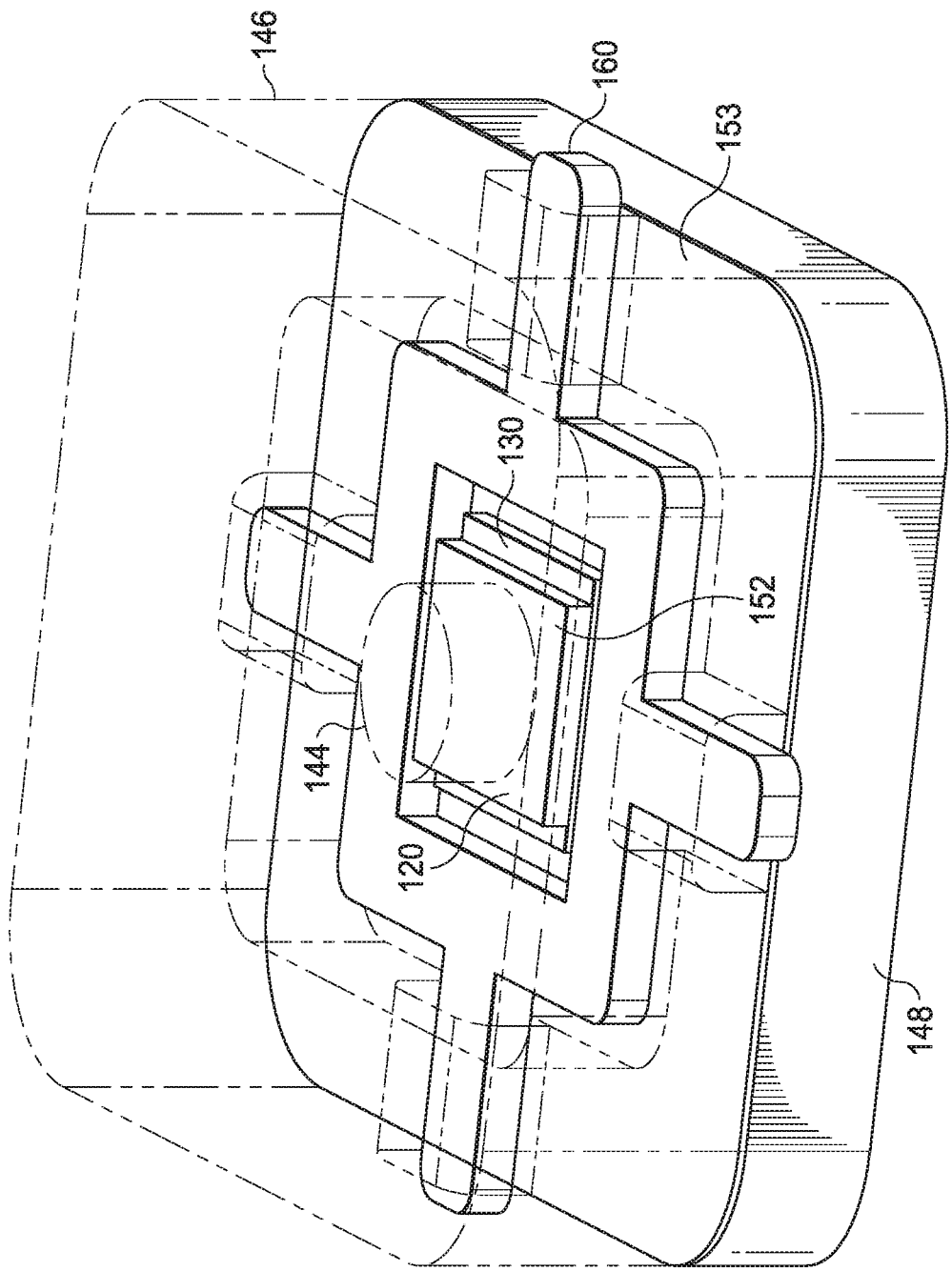
FIG. 6B illustrates a perspective view of the load sensor package of FIG. 5A.
Figure 6C:
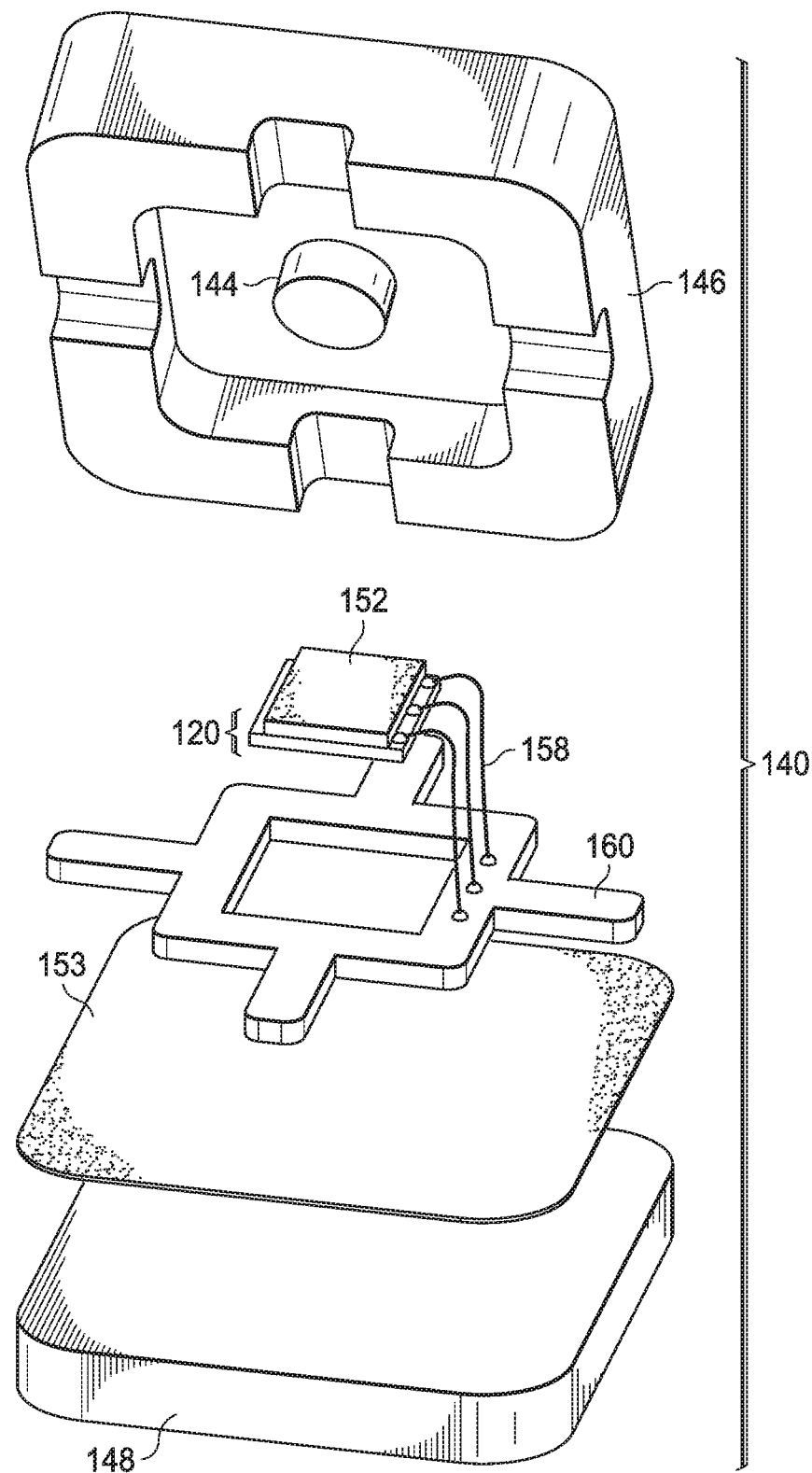
FIG. 6C illustrates an exploded view of the load sensor package of FIG. 5B.

FIG. 6A illustrates a cross-sectional view of another embodiment of a load sensor package 140, FIG. 6B illustrates a corresponding perspective view, and FIG. 6C illustrates a perspective view of a quarter section of the load sensor package 140. In this embodiment, the foot print of the base 148 and the cap 142 are substantial equal. The column 144 and the peripheral structure 146 are formed to the cap 142 as a single monolithic unit. As illustrated in the perspective view of FIG. 6B, a PCB 160 which surrounds the load sensor 120 and spans the cavity of the load sensor package may be soldered to the surface of the base 148. The PCB 160 includes a central cutout region through which the load sensor 120 is attached to the base 148.

In order to detect the electrical signal of the load sensor 120, unlike the embodiment of FIG. 5A-5B, the PCB 160 includes sections that may extend through the peripheral structure 146 to the exterior of the load sensor package 140.

Figure 7:
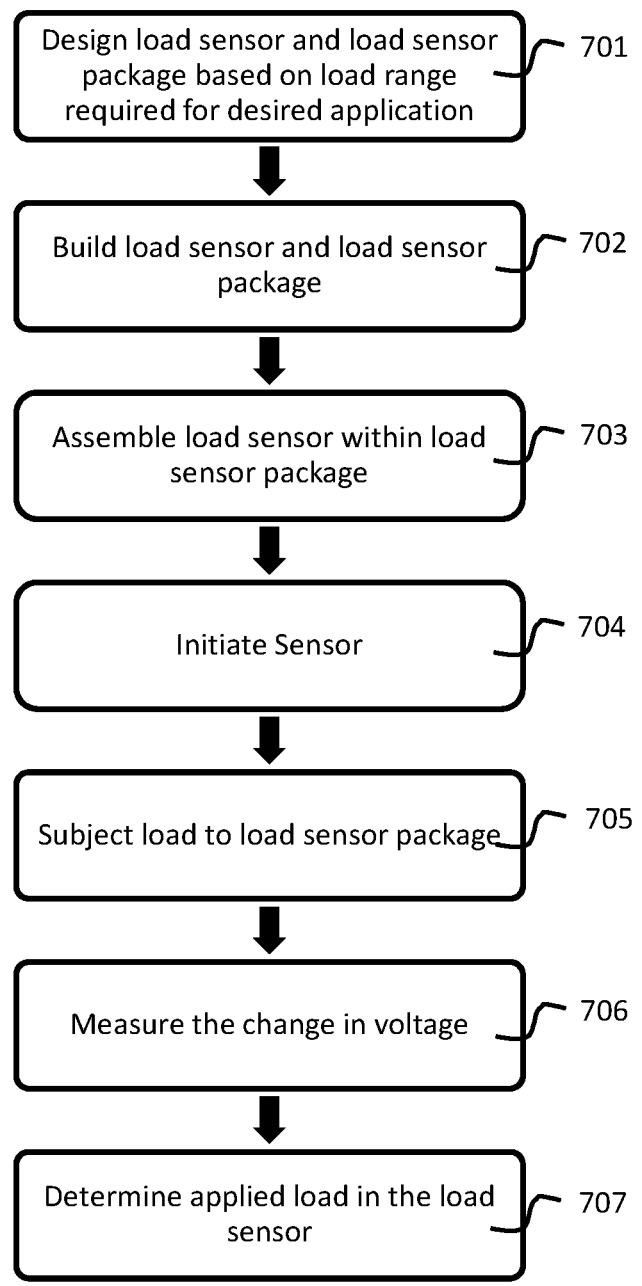
FIG. 7 is a flow chart representing a method that includes the design, fabrication, and application of a load sensor package.

FIG. 7 is a flow chart representing a method that includes the design, fabrication, and application of a load sensor package in accordance with various embodiments of the present invention.

The method includes determining the operating window for the load sensor and designing a load sensor 120 and load sensor package 140 based on the operating range (step 701). The design process includes selecting materials for the load sensor 120 and the load sensor package 140, determining a layout of the load sensor 120 and the load sensor package 140, sizing the various elements of the load sensor 120 and the load sensor package 140 to determine the appropriate amount of the predetermined fraction of the load that is to be transferred to the load sensor. The design step also includes determining an electrical connection between the load sensor 120 and the body of the load sensor package 140.

The selection of materials involves consideration of the coefficient of thermal expansion, Young's modulus, Poisson ratio, ductility and ultimate strength for the load sensor package 140 so that materials with less mismatch are selected. In addition to these properties, the melting temperature and processing temperature of the die bonding materials is considered in the design of the package. The material selection for the load sensor 120 includes a semiconductor material with appropriate piezoresistive components that may be harnessed to isolate the vertical component of the stress, for example, using a Wheatstone bridge circuit described previously. The die bonding materials are selected to enable effective formation of the package that does not degrade prior components that are already formed. Moreover, the die bonding materials are used to compensate any vertical misalignment in assembly or tolerance mismatch of production between the load sensor 120 and the load sensor package 140. The material selection for the load sensor package 140 includes a cap 142, a column 144, a peripheral structure 146, a base 148, die bonding materials 151-153, metallic pins 154, and support shields 156. The cap 142, column 144, peripheral structure 146, and base 148 may be comprised of a single low thermal expansion material, such as iron-nickel alloys such as alloy-42 ($Fe_{0.58}Ni_{0.42}$) and invar ($Fe_{0.64}Ni_{0.36}$).

After the materials have been selected, the load sensor 120 and the load sensor package 140 is fabricated independently (step 702). The load sensor 120 is processed using conventional semiconductor processing. Similarly, the elements of the load sensor package 140 are fabricated using conventional packaging processes.

Referring next to step 703, the load sensor 120 is assembled into the load sensor package 140 and sealed to form a hermetically sealed package. For example, the load sensor 120 is placed into the cavity of the housing of the load sensor package 140 and attached using die bonding materials 151-153.

Referring next to step 704, the load sensor package 140 is initialized and calibrated. For example, the previously described calibration coefficient (correction factor k described above) and predetermined fraction described above (fractional amount of the load transferred to the load sensor) may be determined by applying known amounts of loads.

As next illustrated in step 705, the load sensor package 140 may be utilized to sense an applied load. If the load sensor package is used to determine fluid pressure, it is placed inside an appropriate medium. Similarly, the load sensor package may be placed under appropriate loading conditions. The input voltage to the Wheatstone bridges is applied through the leads of the load sensor package to the load sensor.

As further illustrated in step 706, a change in voltage between the various output nodes of the two Wheatstone bridges (described in FIG. 1A) is measured. Based on the measure voltage outputs, and calibration of the load sensor, the applied load is estimated (step 707). In various embodiments, steps 706 and 707 may be implemented in a front end circuit. In various embodiments, the change in voltage due to an applied load is within the measurable range of the front end circuit. As an illustration, a 10 MPa increase in load produces a 10 mV change in the measured (delta) voltage between the two Wheatstone bridges. This change in voltage can be sensed by the front end circuit. In some embodiments, the front end circuit may also be formed within the load sensor 120. Alternatively, the front end circuit may be packaged within the housing of the load sensor package 140. In further embodiments, the front end circuit is packaged independently from the load sensor package 140.

In an implementation (example one), a load sensor package includes a housing having a cap, a column, a peripheral structure, and a base. The base includes a major surface configured to mount a stress sensor, while the cap includes a cap major surface configured to receive a load to be measured. The column is configured to transfer a predetermined fraction of the load to be measured to the base through the stress sensor. The peripheral structure is configured to transfer the remaining fraction of the load to be measured to the base.

In an implementation of example one (referred herein as example two), the stress sensor comprises a first semiconductor layer comprising a first major surface configured to receive the predetermined fraction of the load to be measured. A second semiconductor layer is disposed under the first semiconductor layer. The second semiconductor layer comprises a first resistor and a second resistor. The first resistor is oriented in a first direction and comprises a first type of doping. The second resistor is oriented in the first direction and comprises the first type of doping, the first semiconductor layer comprising a second major surface configured to be attached to the second semiconductor layer. A first die bonding layer is disposed between the first semiconductor layer and the second semiconductor layer. The first die bonding layer comprises an opening. The opening is disposed directly over the first resistor and overlaps the first resistor, where the second resistor contacts the first die bonding layer.

The implementation of example two (referred herein as example three), may further comprise a second die bonding layer disposed between the column of the housing and the first semiconductor layer. In one implementation of example three, the housing comprises an iron-nickel alloy, the first semiconductor layer and the second semiconductor layer comprise silicon, the first die bonding layer comprises glass, and the second die bonding layer comprises a silver sinter, gold-tin alloy, or gold-germanide.

In an implementation of example one, the column is attached to the stress sensor and the stress sensor is attached to the base.

The implementation of example one (referred herein as example six), may further comprise leads extending through the peripheral structure. The implementation of example six, may further comprise bonding pads on the stress sensor and bond wires coupled between the bonding pads of the stress sensor to the leads.

In an implementation of example one, the load sensor package is hermetically sealed.

In an implementation of example one, the base comprises a ledge comprising leads extending away from a side surface of the peripheral structure.

The implementation of example one (referred herein as example ten), may further comprise a printed circuit board disposed over the base. The printed circuit board comprises a cutout for the stress sensor, wherein the printed circuit board is coupled to bonding pads of the stress sensor. The implementation of example ten, may further comprise leads extending through the housing; and bond wires coupled between the printed circuit board and the leads, where the printed circuit board is within the housing. In an implementation of example ten, a portion of the printed circuit board extends through a side surface of the peripheral structure.

In accordance with a second embodiment of the present invention (example thirteen), a sensor system includes a semiconductor substrate, a first bridge circuit, and a second bridge circuit. The first bridge circuit includes a first semiconductor stress sensor disposed in the semiconductor substrate. The first semiconductor stress sensor is in a plane stress state. The second bridge circuit includes a second semiconductor stress sensor disposed in the semiconductor substrate. The second semiconductor stress sensor is responsive to changes of in-plane and out-of-plane stresses.

In an implementation of example thirteen (referred herein as example fourteen), the first bridge circuit comprises a first resistor, a second resistor, a third resistor, and a fourth resistor, and the second bridge circuit comprises a fifth resistor, a sixth resistor, a seventh resistor, and an eighth resistor.

In one implementation of example fourteen (referred herein as example fifteen), the first resistor and the fifth resistor comprises p-type resistors oriented in a first direction, while the second resistor and the sixth resistor comprises n-type resistors oriented in a second direction. The third resistor and the seventh resistor comprise p-type resistors oriented in the second direction, while the fourth resistor and the eighth resistor comprise n-type resistors oriented in the first direction.

In one implementation of example fifteen, the second resistor and the fourth resistor are responsive to changes in the lateral and transverse in-plane stresses and not responsive to vertical stress, where the sixth resistor and the eighth resistor are responsive to the lateral, transverse, and vertical stresses.

In one implementation of example sixteen (referred herein as example seventeen), the first bridge circuit further comprises a first branch comprising a first node serially connecting the first resistor and the second resistor; and a second branch comprising a second node serially connecting the third resistor and the fourth resistor. The first branch is connected in parallel with the second branch, the first resistor being connected to the fourth resistor and the second resistor being connected to the third resistor.

The implementation of example seventeen (referred herein as example eighteen) may further comprise a first output node between first node and the second node.

In one implementation of example eighteen (referred herein as example nineteen), the second bridge circuit further comprises a third branch comprising a third node connecting the fifth resistor and the sixth resistor; and a fourth branch comprising a fourth node connecting the seventh resistor and the eighth resistor. The third branch is connected in parallel with the fourth branch, the fifth resistor is connected to the eighth resistor and the sixth resistor being connected to the seventh resistor.

The implementation of example nineteen (referred herein as example eighteen) may further comprise a second output node between the third node and the fourth node.

In one implementation of example thirteen, the first bridge circuit is a first Wheatstone bridge circuit, and the second bridge circuit is a second Wheatstone bridge circuit.

In accordance with a third embodiment of the present invention (example twenty-two), a load sensor includes a first semiconductor layer that includes a first major surface configured to receive a load to be measured. A second semiconductor layer is disposed under the first semiconductor layer. The second semiconductor layer includes a first resistor and a second resistor. The first resistor is oriented in a first direction and includes a first type of doping. The second resistor is oriented in the first direction comprising the first type of doping, where the first semiconductor layer includes a second major surface configured to be attached to the second semiconductor layer. A die bonding layer is disposed between the first semiconductor layer and the second semiconductor layer. The die bonding layer includes a first opening, where the first opening is disposed directly over the first resistor and overlaps the first resistor, and the second resistor contacts the die bonding layer.

In one implementation of example twenty-two (referred herein as twenty-three), the second semiconductor layer further comprises a third resistor oriented in a second direction and comprising the first type of doping, and a fourth resistor oriented in the second direction comprising the first type of doping.

In one implementation of example twenty-three (referred herein as twenty-four), the second semiconductor layer further comprises a fifth resistor oriented in the first direction comprising a second type of doping, the second type of doping being opposite to the first type of doping. A sixth resistor is oriented in the first direction comprising the second type of doping. A seventh resistor is oriented in the second direction comprising the second type of doping. An eighth resistor is oriented in the second direction comprising the second type of doping.

In one implementation of example twenty-four, the die bonding layer further comprises a second opening, where the second opening is disposed directly over the third resistor and overlaps the third resistor. The fourth resistor, the fifth resistor, the sixth resistor, the seventh resistor, and the eighth resistor contact the die bonding layer.

In one implementation of example twenty-two, the second semiconductor layer is shaped different than the first semiconductor layer. In another implementation of example twenty-two, all bonding pads of the load sensor are disposed along a single side of the second semiconductor layer. In another implementation of example twenty-two, the bonding pads of the load sensor are disposed on all corners of the second semiconductor layer. In another implementation of example twenty-two, the second semiconductor layer is shaped to have an octagonal shape. In another implementation of example twenty-two, the die bonding layer comprises a thickness between 5 µm and 200 µm and comprises glass.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications or embodiments.

What is claimed is:

1. A load sensor package comprising:
a housing comprising a cap, a column, a peripheral structure, and a base, wherein the base comprises a major surface configured to mount a stress sensor, wherein the cap comprises a cap major surface configured to receive a load to be measured, wherein the column is configured to transfer a predetermined fraction of the load to be measured to the base through the stress sensor, wherein the peripheral structure is configured to transfer the remaining fraction of the load to be measured to the base, and wherein the predetermined fraction of the load is between 0.1 to 0.9.

2. The load sensor package of claim 1, wherein the stress sensor comprises:
a first semiconductor layer comprising a first major surface configured to receive the predetermined fraction of the load to be measured;
a second semiconductor layer disposed under the first semiconductor layer, the second semiconductor layer comprising a first resistor and a second resistor, the first resistor oriented in a first direction and comprising a first type of doping, the second resistor oriented in the first direction and comprising the first type of doping, the first semiconductor layer comprising a second major surface configured to be attached to the second semiconductor layer; and
a first die bonding layer disposed between the first semiconductor layer and the second semiconductor layer, the first die bonding layer comprising an opening, wherein the opening is disposed directly over the first resistor and overlaps the first resistor, wherein the second resistor contacts the first die bonding layer.

3. The load sensor package of claim 2, further comprising a second die bonding layer disposed between the column of the housing and the first semiconductor layer.

4. The load sensor package of claim 3, wherein the housing comprises an iron-nickel alloy, wherein the first semiconductor layer and the second semiconductor layer comprise silicon, wherein the first die bonding layer comprises glass, and wherein the second die bonding layer comprises a silver sinter, gold-tin alloy, or gold-germanide.

5. The load sensor package of claim 1, wherein the column is attached to the stress sensor and the stress sensor is attached to the base.

6. The load sensor package of claim 1, further comprising leads extending through the peripheral structure.

7. The load sensor package of claim 6, further comprising bonding pads on the stress sensor and bond wires coupled between the bonding pads of the stress sensor to the leads.

8. The load sensor package of claim 1, wherein the load sensor package is hermetically sealed.

9. The load sensor package of claim 1, wherein the base comprises a ledge comprising leads extending away from a side surface of the peripheral structure.

10. The load sensor package of claim 1, further comprising a printed circuit board disposed over the base, wherein the printed circuit board comprises a cutout for the stress sensor, wherein the printed circuit board is coupled to bonding pads of the stress sensor.

11. The load sensor package of claim 10, further comprising:
leads extending through the housing; and
bond wires coupled between the printed circuit board and the leads, wherein the printed circuit board is within the housing.

12. The load sensor package of claim 10, wherein a portion of the printed circuit board extends through a side surface of the peripheral structure.

13. A sensor system comprising:
a semiconductor substrate;
a first bridge circuit comprising a first semiconductor stress sensor disposed in the semiconductor substrate, the first semiconductor stress sensor being in a plane stress state; and
a second bridge circuit comprising a second semiconductor stress sensor disposed in the semiconductor substrate, the second semiconductor stress sensor being responsive to changes of in-plane and out-of-plane stresses.

14. The system of claim 13, wherein the first bridge circuit comprises a first resistor, a second resistor, a third resistor, and a fourth resistor, wherein the second bridge circuit comprises a fifth resistor, a sixth resistor, a seventh resistor, and an eighth resistor.

15. The system of claim 14, wherein the first resistor and the fifth resistor comprises p-type resistors oriented in a first direction, wherein the second resistor and the sixth resistor comprises n-type resistors oriented in a second direction, wherein the third resistor and the seventh resistor comprises p-type resistors oriented in the second direction, wherein the fourth resistor and the eighth resistor comprises n-type resistors oriented in the first direction.

16. The system of claim 15, wherein the second resistor and the fourth resistor are responsive to changes in the lateral and transverse in-plane stresses and not responsive to vertical stress, wherein the sixth resistor and the eighth resistor are responsive to the lateral, transverse, and vertical stresses.

17. The system of claim 16, the first bridge circuit further comprising:
a first branch comprising a first node serially connecting the first resistor and the second resistor; and
a second branch comprising a second node serially connecting the third resistor and the fourth resistor, wherein the first branch is connected in parallel with the second branch, the first resistor being connected to the fourth resistor and the second resistor being connected to the third resistor.

18. The system of claim 17, further comprising a first output node between first node and the second node.

19. The system of claim 18, the second bridge circuit further comprising:
a third branch comprising a third node connecting the fifth resistor and the sixth resistor; and
a fourth branch comprising a fourth node connecting the seventh resistor and the eighth resistor, wherein the third branch is connected in parallel with the fourth branch, the fifth resistor being connected to the eighth resistor and the sixth resistor being connected to the seventh resistor.

20. The system of claim 19, further comprising a second output node between the third node and the fourth node.

21. The system of claim 13, wherein the first bridge circuit is a first Wheatstone bridge circuit, and wherein the second bridge circuit is a second Wheatstone bridge circuit.

22. The system of claim 13, further comprising a housing comprising a cap, a column, a peripheral structure, and a base, wherein the base comprises a major surface configured to mount the semiconductor substrate, wherein the cap comprises a cap major surface configured to receive a load to be measured, wherein the column is configured to transfer a predetermined fraction of the load to be measured to the base through the semiconductor substrate, wherein the peripheral structure is configured to transfer the remaining fraction of the load to be measured to the base.

23. The system of claim 22, further comprising leads extending through the peripheral structure.

24. The system of claim 23, further comprising bonding pads on the stress sensor and bond wires coupled between the bonding pads of the stress sensor to the leads.

25. A load sensor comprising:
a first semiconductor layer comprising a first major surface configured to receive a load to be measured;
a second semiconductor layer disposed under the first semiconductor layer, the second semiconductor layer comprising a first resistor, a second resistor, a third resistor, and a fourth resistor, the first resistor oriented in a first direction and comprising a first type of doping, the second resistor oriented in the first direction and comprising the first type of doping, the third resistor oriented in a second direction and comprising the first type of doping, and the fourth resistor oriented in the second direction comprising the first type of doping, wherein the first semiconductor layer comprises a second major surface configured to be attached to the second semiconductor layer; and
a die bonding layer disposed between the first semiconductor layer and the second semiconductor layer, the die bonding layer comprising a first opening, wherein the first opening is disposed directly over the first resistor and overlaps the first resistor, wherein the second resistor contacts the die bonding layer.

26. The load sensor of claim 25, wherein the second semiconductor layer further comprises:
a fifth resistor oriented in the first direction comprising a second type of doping, the second type of doping being opposite to the first type of doping,
a sixth resistor oriented in the first direction comprising the second type of doping,
a seventh resistor oriented in the second direction comprising the second type of doping, and
an eighth resistor oriented in the second direction comprising the second type of doping.

27. The load sensor of claim 26, wherein the die bonding layer further comprises a second opening, wherein the second opening is disposed directly over the third resistor and overlaps the third resistor, wherein the fourth resistor, the fifth resistor, the sixth resistor, the seventh resistor, and the eighth resistor contacts the die bonding layer.

28. The load sensor of claim 25, wherein the second semiconductor layer is shaped different than the first semiconductor layer.

29. The load sensor of claim 25, wherein all bonding pads of the load sensor are disposed along a single side of the second semiconductor layer.

30. The load sensor of claim 25, wherein the bonding pads of the load sensor are disposed on all corners of the second semiconductor layer.

31. The load sensor of claim 25, wherein the second semiconductor layer is shaped to have an octagonal shape.

32. The load sensor of claim 25, wherein the die bonding layer comprises a thickness between 5 µm and 200 µm and comprises glass.

* * * * *